United States Patent
Yokoyama et al.

(10) Patent No.: US 7,579,665 B2
(45) Date of Patent: Aug. 25, 2009

(54) COLOR LIGHT RECEIVING DEVICE AND IMAGE PICKUP DEVICE

(75) Inventors: Daisuke Yokoyama, Kanagawa (JP); Toshiaki Fukunaga, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 1007 days.

(21) Appl. No.: 11/189,784

(22) Filed: Jul. 27, 2005

(65) Prior Publication Data

US 2006/0023094 A1 Feb. 2, 2006

(30) Foreign Application Priority Data

Aug. 2, 2004 (JP) ............... 2004-225848

(51) Int. Cl.
*H01L 31/0232* (2006.01)
(52) U.S. Cl. ............... 257/440; 257/443; 257/E27.134; 257/E27.135
(58) Field of Classification Search ................. 257/440, 257/443, 444, E27.134, E27.135, E27.142
See application file for complete search history.

(56) References Cited

U.S. PATENT DOCUMENTS 5,965,875 A 10/1999 Merrill

2003/0209651 A1 11/2003 Iwasaki
2005/0087829 A1 * 4/2005 Merrill et al. ............... 257/440

FOREIGN PATENT DOCUMENTS

JP A 7-038136 2/1995

* cited by examiner

*Primary Examiner*—Minh-Loan T Tran
(74) *Attorney, Agent, or Firm*—Sheldon J. Moss; Margaret A. Burke

(57) ABSTRACT

A light receiving device and an image pickup device in which a plurality of light receiving devices are arranged are provided. The light receiving device comprises a single semiconductor substrate and a light receiving device that has a first photoelectric conversion part and a second photoelectric conversion part. The single semiconductor substrate comprises regions of a first conductivity type and regions of a second conductivity type in an alternately multiply stacked manner. Depths of each of the junction surfaces between the regions of first conductivity type and second conductivity type are formed at depths such that light mainly in the blue or red wavelength regions can be photo-electrically converted. The respective detected wavelengths of the first photoelectric conversion part and second photoelectric conversion part are longer than the central wavelength of the blue wavelength region, and shorter than the central wavelength of the red wavelength region.

16 Claims, 4 Drawing Sheets

WAVELENGTH (/nm)

COLOR LIGHT RECEIVING DEVICE AND IMAGE PICKUP DEVICE

CROSS-REFERENCE TO RELATED APPLICATION

This application claims priority under 35 USC 119 from Japanese Patent Application Nos. 2004-225848, the disclosures of which are incorporated by reference herein.

BACKGROUND OF THE INVENTION

1. Field of the Invention

The present invention relates to a color light receiving device and an image pickup device.

2. Description of the Related Art

As conventional light receiving devices, metal oxide semiconductor (MOS) capacitors and pn junction diodes made of semiconductors such as crystalline silicon, amorphous silicon, GaAs, or the like, are generally used. These light receiving devices can also be utilized as photoelectric conversion sections in image pickup devices, such as charge coupled devices (CCD) and complementary metal oxide semiconductors (CMOS). Although CCD and CMOS sensors are different from each other in signal reading-out method, however, for either image pickup device, a light receiving device having the same configuration can generally be used. Such an image pickup device is used for a variety of applications, including image cameras, copying machines, and facsimile machines.

However, conventional light receiving devices have had only the function to convert the intensity of light to an electric signal, having no ability to detect any particular color. For this a single-plate method is used. This method provides a color signal by covering individual photosensors with a monochromatic color filter, and combining the signal from a photosensor with those from adjacent photosensors, which are dedicated to other colors. As colors of the color filters, red (hereafter, may be expressed as R), green (hereafter, may be expressed as G), and blue (hereafter, may be expressed as B) are used as the three primary colors of light. Or, as complementary colors thereof, cyan (hereafter, may be expressed as C), magenta (hereafter, may be expressed as M), and yellow (hereafter, may be expressed as Y) are used. The method which adds green, having a wide visible region, to the three complementary colors to provide 4 colors has also been proposed.

For high image quality applications, a multiplate method, which separates a color image with a color separation prism and uses three or four image pickup devices, is employed. In an example, after the incident light is color-separated with a prism, the R, G, B three colors are sensed by respective photosensors. Further, a four-plate method, which adopts two photosensors for G in order to enhance the resolution, is also known.

However, the single-plate method has several problems.

A first of the problems is that a part of the light is absorbed by the color filter, resulting in the sensitivity being lowered. When the light is passed through a red color filter, the blue color and the green color are lost in the color filter, and thus only one third of the light is utilized at most.

A second of the problems is that, because the RGB three colors are detected in different locations, color separation is caused, and false color tends to be produced. Especially, false color tends to occur at the boundary between light and shade of the subject, and the false color can cause a moire phenomenon. To avoid the problem of such a false color or a moire phenomenon, an optical low-pass filter is used, however, the optical low-pass filter lowers the resolution. With an optical low-pass filter, the thinner the filter the lower the reduction in resolution will be, however, the effectiveness is also lowered, and thus reciprocal characteristics are exhibited.

The multiplate method also presents problems. The multiplate method requires a high precision prism and a color separation film (a dichroic mirror), and requires a highly accurate alignment technique to be used, which results in the cost and the size of the apparatus being increased. In addition, the loss of light in the prism and other optical elements is also a critical problem.

In order to eliminate such a false color problem, a configuration of a stacked type image sensor has been proposed (for example, refer to U.S. Pat. No. 5,965,875 and Japanese Patent Application Laid-Open (JP-A) No. 7-38136). If light receiving devices having sensitivity to different colors can be stacked, the light can be separated into respective colors in the same (planar) location, thus the problem of false color due to the difference in light receiving location can be avoided. With such a configuration, the low-pass filter is theoretically not needed.

The stacked type image sensor proposed comprises stacked light receiving sections, having a configuration in which the wavelength dependency of the absorption factor of Si is utilized for color separation in the direction of the depth thereof. This image pickup device is effective against a false color. However, this image pickup device carries out color separation on the basis of the depth of light entering into the Si, thus the spectral range detected by the respective light receiving sections is broad, which has resulted in insufficient color separation. This causes reduction in the amount of light converted to a signal in practice, with the sensitivity being lowered. In addition, there occurs a problem that, although a certain degree of color separation can be provided by design of the depth of the P-N junction in the respective light receiving sections, the design involves a trade-off relationship between the sensitivity and the color separation. That is if the color separation is enhanced, the sensitivity is decreased, for example. Therefore, this design has inherent limitations.

Color separation by the stacked type image sensor is insufficiently performed especially between blue and green colors. To solve this problem, a method which provides a green color sensor on or above the top of the Si substrate has been proposed (for example, refer to U.S. Patent Application Publication No. 2003/0209651A1).

The above-described methods, however, still leave much difference in spectral sensitivity comparing to human eyes, and thus a development in the technology to have the spectral sensitivity of image sensors be similar to that of human eyes has been desired.

SUMMARY OF THE INVENTION

The present invention provides a light receiving device having a high color separation capability and a near-human spectral sensitivity, and an image pickup device using the light receiving device.

In the development process of a stacked image sensor, when color separation is carried out in the depth direction of a Si substrate (using depth difference), to get near to the spectral sensitivity of the human eye it is important to add in compensation for green light as well as blue-green light. Here, in the invention, in order to give sufficient color separation near the green and blue-green colors, separate first and second photoelectric conversion parts are provided at the Si substrate, and light receiving devices are designed such that green and blue-green light is received. As a result of this, as well as the problem of false colors when receiving different colors at the same (planar) location being solved, light receiving devices with a spectral sensitivity which is very similar indeed to that of the human eye, and image pickup devices using the light receiving devices, can be obtained.

Namely, the present invention provides a light receiving device comprising a single semiconductor substrate and a light receiving device that has a first photoelectric conversion part and a second photoelectric conversion part and is provided on or above an light entering side of the semiconductor substrate, wherein: the single semiconductor substrate comprises regions of a first conductivity type and regions of a second conductivity type in an alternately multiply stacked manner, wherein the second conductivity type is a conductivity type opposite to the first conductivity type; each of junction surfaces between the regions of the first conductivity type and the regions of the second conductivity type is formed to have a depth which enables converting light, which is mainly in the blue or red wavelength regions, to electricity; the first photoelectric conversion part and second photoelectric conversion part detect light in two different wavelength regions; and the respective detected wavelengths of the first photoelectric conversion part and second photoelectric conversion part are longer than the central wavelength of the blue wavelength region, and shorter than the central wavelength of the red wavelength region.

The present invention further provides an image pickup device in which a plurality of the light receiving devices are arranged.

The image pickup device of the present invention is applicable to digital cameras, video cameras, facsimile machines, scanners, copying machines, X-ray image sensors, and any other apparatuses using an image pickup device. In addition, the light receiving device of the present invention is applicable to bio-sensors, chemical sensors, and any other optical sensors.

DETAILED DESCRIPTION OF THE INVENTION

Figure 1:
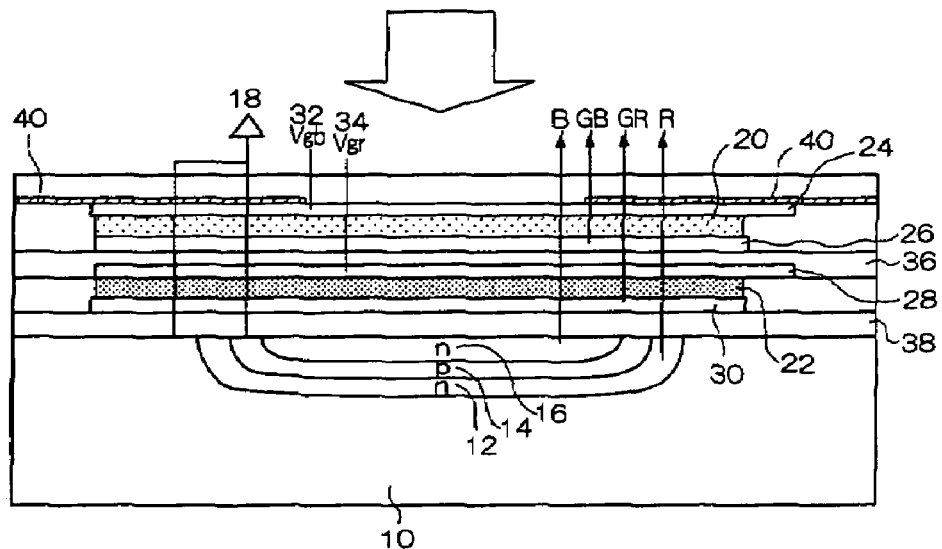
FIG. 1 is a sectional view illustrating the configuration of a first light receiving device.

The present invention provides an image sensor having a stacked type structure, and being capable of detecting respective colors in the same planar location. Therefore, firstly the present invention provides an effect of no false color being generated. False color is a false signal occurring in an image component having a spatial frequency higher than the Nyquist frequency being returned in the region lower than the Nyquist frequency, which is called an aliased signal. If an image is constructed from a signal which is has a large amount of aliasing, a so-called moire phenomenon occurs.

Secondly, the present invention allows a large area to be provided for the light receiving section, which permits realization of an image pickup device having a high resolution and a high aperture ratio. In other words, if an image pickup device is manufactured with a given precision, it can acquire a higher definition image. Further, utilization efficiency of light can be improved.

When a conventional color filter is used, three sub-pixels, R, B, G constitute a single pixel, thus when sub-pixels of the same size are used, the size of a single pixel is increased in proportion to the number of colors (which is three for R, B, G for example).

Thirdly, use of the present invention eliminates the need for using a color filter or an optical low-pass filter and other optical parts.

The present invention has a further feature that a first photoelectric conversion part and a second photoelectric conversion part are disposed outside the semiconductor substrate. The stacked structure of the semiconductor substrate mainly detect light having a wavelength in regions of blue light or red light, and the first photoelectric conversion part and a second photoelectric conversion part detect a green light and blue-green light wavelength region, which reside between the ranges of blue light or red light. Particularly, the first photoelectric conversion part preferably has a maximum value in the frequency range of 500 to 530 nm, and the second photoelectric conversion part preferably has a maximum value in the frequency range of 530 to 600 nm.

Fourthly, by having a stacked structure in which such a first photoelectric conversion part and a second photoelectric conversion part are disposed, the present invention can provide a light receiving device which has a sensitivity spectral which is highly close to that of human eyes.

In light receiving devices using the wavelength dependent absorption coefficient of Si, since there is a characteristic absorption of Si near to 480 nm, absorption of blue light in the red light receiving part has been a problem in the past. A fifth aspect is that in the invention, since the light of wavelength near to 480 nm is received in the first photoelectric conversion part, there is good color reproducibility.

A sixth aspect of the invention is, the realization of good blue color and green color separation. Conventionally, in color separation of stacked image sensors, in particular the color separation of blue and green has not been sufficient, but in the invention by providing on an upper portion of the Si substrate a green and blue-green sensor this problem has been eliminated.

Seventhly, unlike the multi-plate method image pickup system, only one image pickup device is required, and the need to use a high precision color separation prism, a dichroic mirror, and the like is eliminated, thus the present invention is compact and minimizes cost.

Hereinafter, the light receiving device and the image pickup device of the present invention will be described in detail. Explanation about signal calculations is also provided below.

Light Receiving Device (1) Outline of Light Receiving Device of the Present Invention The light receiving device of the present invention can utilize the photoconductive effect and the photovoltaic effect. Configurations of light receiving devices of the present invention include photoconductive type, p-n junction type, Schottky junction type, PIN junction type, MSN (metal-semiconductor-metal) type, and a phototransistor type.

The present invention uses a light receiving device, wherein a region of a first conductivity type and a region of a second conductivity type, which is a conductivity type opposite to the first conductivity type, are alternately multiply stacked in a single semiconductor substrate. The respective junction surfaces of the region of the first conductivity type and the region of the second conductivity type are formed at appropriate depths to enable photoelectric conversion of most of the light in red wavelength band or blue wavelength band. As a single semiconductor substrate, a single crystalline silicon substrate is preferable; it allows color separation utilizing the absorption wavelength characteristics which depends upon the depth of the silicon substrate.

Further, with the present invention, a first photoelectric conversion part and a second photoelectric conversion part, which detect light having a wavelength which is longer than the central wavelength of the blue light wavelength band and is shorter than the central wavelength of the red light wavelength band, is provided outside the semiconductor substrate. The first photoelectric conversion part preferably has a maximum value in the frequency range of 500 to 530 nm. Namely, the first photoelectric conversion part is preferably a blue-green color sensor. The second photoelectric conversion part preferably has a maximum value in the frequency range of 530 to 600 nm. Namely, the second photoelectric conversion part is preferably a green color sensor.

(2) The First and Second Photoelectric Conversion Parts

The first photoelectric conversion part has a quantum efficiency curve with a maximum absorption value which is in the range of 500 to 530 nm, and more preferably in the range of 510 nm to 525 nm. The second photoelectric conversion part has a quantum efficiency curve with a maximum absorption value which is in the range of 530 to 600 nm, and more preferably in the range of 530 nm to 570 nm. The light absorption half widths are preferably, for both the first photoelectric conversion part and the second photoelectric conversion part, 40 nm to 100 nm, and more preferably 40 nm to 80 nm.

The first and second photoelectric conversion parts can be formed from organic materials or inorganic semiconductors but, from the perspective of high absorption coefficients and spectral sensitivity, it is preferable that they are made from organic semiconductors.

The organic semiconductors for the structure of the first and second photoelectric conversion parts are not particularly limited. Preferable examples include: acenes with typical examples being perylene, tetracyne, pentacene, pyrene, or their derivatives; conjugate polymer compounds such as polyacetylene derivatives, polythiophene derivatives with thiophene rings, poly (3-alkyl thiophene) derivatives, poly (3,4-ethylene dioxy thiophene) derivatives, polythienylene vinylene derivatives, polyphenylene derivatives with benzene rings, polyphenylene vinylene derivatives, polypyridine derivatives with nitrogen atoms, polypyrrole derivatives, polyaniline derivatives, and polyquinolene derivatives; oligomers with typical examples being dimethyl sexithiophene and quaterthiophene; discotic liquid crystals with typical examples being triphenylene; smectic liquid crystals with typical examples being phenylnapthalene derivatives, and benzothiazole derivatives; liquid crystal polymer copolymers with typical examples being poly (9,9-dialkyl fluorene bithiophene); copper phthalocyanine derivatives; zinc phthalocyanine derivatives; polythiophene derivatives; polyparaphenylene derivatives; and merocyanine coloring materials.

For organic semiconductors, general coloring materials and dyes/pigments can be included, examples of these including: coloring materials such as rhodamine B, eosin Y, and coumalin; azo pigments and squarylium pigments; azulenium pigments; and phthalocyanine pigments. Further, in order to adjust the electrical conductivity, applicable dopants many be included. As types of dopants there are the following examples: acceptors such as $I_2$, $Br_2$, $Cl_2$, ICl, $BF_3$, $PF_5$, $H_2SO_4$, $FeCl_3$, TCNQ (tetracyanoquinodimethanide); donors such as surfactants of Li, K, Na, and Eu salts of alkyl sulfonic acid, and alkyl benzene sulfonic acid.

Also, it is possible to conjugate organic coloring materials with light absorptions within the above ranges to inorganic semiconductors or metals. Examples of organic coloring materials which can be used are disclosed in Japanese Patent Application Laid-Open (JP-A) No. 2003-332551.

The product of the thickness and the absorption coefficient of the first photoelectric conversion part is preferably in the range 0.8 to 2.6, more preferably 1.0 to 2.0, and even more preferably 1.2 to 1.6.

The product of the thickness and the absorption coefficient of the second photoelectric conversion part is preferably in the range 3.0 to 15.0, more preferably 5.0 to 10.0, and even more preferably 7.2 to 8.0.

It is preferable that the first photoelectric conversion part is disposed closer to the light entering side than the second photoelectric conversion part.

Also, electrodes are provided on both surfaces of the first photoelectric conversion part. From the electrode on one side the blue-green color light signal is output, and the other electrode is connected to a biasing electrode. Electrodes are provided on both surfaces of the second photoelectric conversion part. From the electrode on one side the green color light signal is output, and the other electrode is connected to a biasing electrode. So that the light which passes through the first and second photoelectric conversion parts can arrive at the light receiving part of the semiconductor substrate, where the blue and red color separation is carried out, the electrodes are transparent electrodes.

Between the first photoelectric conversion part and the second photoelectric conversion part, in order to separate the signals, it is preferable to provide an insulating layer. Also, a common power source can be provided on the power source side of the connections.

Electrodes provided on the first photoelectric conversion part, the second photoelectric conversion part, and a light receiving section which performs color separation between blue color and red color in the semiconductor substrate and is described in the followings are not particularly limited, provided that they are conductors. Examples thereof include Al, Cu, Ti, Au, Pt, Ag, Cr, and other metallic materials, and polysilicone, silicide, indium tin oxide (ITO), indium zinc oxide (IZO), ZnO, $SnO_2$ and other inorganic materials. Preferable examples thereof further include conductive polymers represented by highly doped polypyridine, polyacetylene, polyaniline, polypyrrole, and polythiophene; conductive inks in which carbon particles, silver particles, or the like are dispersed; and the like. Preferable examples thereof include transparent electrode materials such as ITO, IZO, ZnO, $SnO_2$ or the like.

In order to separate signals, an insulating layer is preferably provided between the photoelectric conversion parts and the semiconductor substrate. Further, the photoelectric conversion parts and the semiconductor substrate may be spaced apart from each other.

(3) Semiconductor Substrate

The present invention provides a light receiving section which carries out color separation by utilizing the absorption wavelength characteristics which depend upon the depth of the pn junction surface which is formed in a single semiconductor substrate. As the semiconductor substrate, a silicon array which is arrayed at a high density can be used, but more preferably, a single crystalline silicon substrate may be used. When a silicon array which is arrayed at a high density is used, there is a need to avoid color mixture, thus a light exclusion film is required to be formed. By forming a transparent insulating film on the topmost surface on the light entering side with an aperture provided, and depositing metal, a light exclusion film is formed.

The longer the wavelength of the light which enters from the front surface is, the more deeply the light penetrates the silicon substrate. Accordingly, blue, green, and red colors are sensed in this order, in the order of the junction surfaces down from the surfaces which reside nearest to the light entering side. However, the light entering from the front surface is light which has passed through the first photoelectric conversion part and the second photoelectric conversion part, and most of the light of blue-green color to blue color has already been eliminated.

It is preferable that the light receiving section detects blue color light having a wavelength of approximately 420 to 500 nm and red color light having a wavelength of approximately 580 to 680 nm.

It is preferable that the junction structure be npn or pnpn, from the light entering side. In particular, by providing a p layer on the front surface to raise the surface potential, holes and electrons generated in the vicinity of the front surface can be trapped to reduce the dark current, thus it is more preferable to adopt a pnpn junction.

A pn photo diode having pnpn four layers is formed in the depth direction of the silicon substrate, by ion injection of an n-type layer, a p-type layer, an n-type layer, and a p-type layer, in this sequence. Because the light which enters the diode from the front surface side, having a longer wavelength, penetrates more deeply, the attenuation coefficients for each particular incident wavelengths are silicon characteristic values, the photo diode is designed such that the depths of the pn junction surfaces cover the respective wavelength bands (B, R) of visible light. Similarly, by forming an n-type layer, a p-type layer, and an n-type layer in this sequence, an npn three-layer diode is obtained. From the n-type layers, optical signals are taken out, and the p-type layers are connected to the ground.

Further, by providing a leading electrode for the respective regions, and applying a prescribed reset potential, the respective regions are depleted, and the capacity of the respective junctions is reduced to a minimum value. Thereby, the capacitance generated on the junction surfaces can be minimized.

(4) Other Components

In order to prevent the manufactured device from being contacted by oxygen, moisture, and the like, a protection layer or a sealing layer may be provided. Examples of the protection layer include a diamond thin film, a metal oxide, a metal nitride, and other inorganic material films; fluorine resin, polyparaxylene, polyethylene, silicone resin, polystyrene resin, and other polymer films; and further light curable resins and the like. In addition, glass, gas impermeable plastic, metal or the like can be used to cover the device section, and with an adequate sealing resin, the device itself can be packaged. In this case, a substance with a high water absorption may be contained in the package.

In order to avoid reception of infrared light in the stacked areas of the silicon substrate, it is preferably to provide an infrared cut filter. Similarly, in order to avoid reception of ultraviolet light in the stacked areas of the silicon substrate, it is preferably to provide an ultraviolet cut filter.

Further, by forming a micro lens array above the top of the light receiving device, the lens condensing efficiency can be improved, thus such an embodiment is also preferable.

(5) Embodiments

Figure 2:
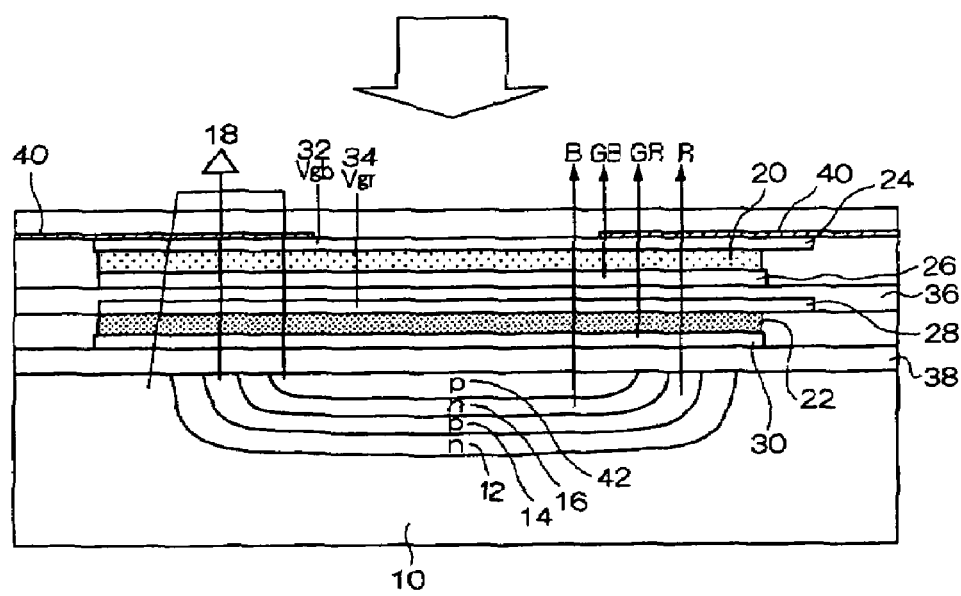
FIG. 2 is a sectional view illustrating the configuration of a second light receiving device.
Figure 3:
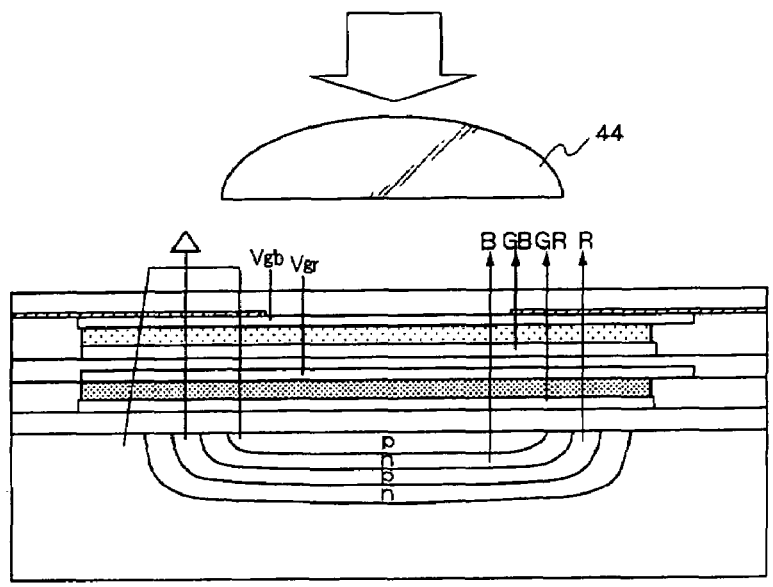
FIG. 3 is a sectional view illustrating the configuration of a third light receiving device.

Hereinafter, preferable embodiments of the first photoelectric conversion part and the second photoelectric conversion part of the present invention will be described in detail based on the attached drawings. In FIG. 1 to FIG. 3, the arrow indicates the incident light.

1) First Embodiment of a Light Receiving Device

FIG. 1 shows a first embodiment of the light receiving device in which an npn junction diode is formed in the silicon substrate, and a first photoelectric conversion part and a second photoelectric conversion part are provided outside the silicon substrate on the light entering side.

In the p-type silicon substrate (10), an n-type region (n well) (12), a p-type region (p well) (14), and an n-type region (n well) (16) are formed. From the n-type region (n well) (12) and the n-type region (n well) (16), a red signal and a green signal are outputted, respectively. For the p-type region (p well) (14), an earth (18) is provided. A first photoelectric conversion part (20) and a second photoelectric conversion part (22) are provided with the above npn constitution on the outside part of a p-type silicon substrate. The first photoelectric conversion part (20) is disposed between transparent electrodes (24) and (26), and the second photoelectric conversion part (22) is disposed between transparent electrodes (28) and (30). The transparent electrodes (24) and (28) are connected to the biasing electrodes Vgb (32) and Vgr (34) respectively. The blue-green signal is extracted from the transparent electrode (26). The green signal is extracted from the transparent electrode (30).

An insulating membrane (36) is provided between the transparent electrode (26) and the transparent electrode (28). An insulating membrane (38) is provided between the transparent electrode (30) and the p-type silicon substrate (10).

A light exclusion film (40) is disposed in a location closer to the light-incidence plane than the transparent electrode (24) such that the light exclusion film (40) does not cover the npn junction surface.

2) Second Embodiment of a Light Receiving Device

FIG. 2 shows a second embodiment of the light receiving device in which a pnpn junction diode is formed in the silicon substrate, and a first photoelectric conversion part and a second photoelectric conversion part are provided outside the silicon substrate on the light entering side.

In the p-type silicon substrate (10), an n-type region (n well) (12), a p-type region (p well) (14), an n-type region (n well) (16), and a p-type region (p well) (42) are formed. Except in that a pnpn junction is formed, this embodiment is similar to the above first embodiment of the light receiving device.

3) Third Embodiment of a Light Receiving Device

FIG. 3 shows an embodiment of the light receiving device in which a micro lens (44) is further provided for the second embodiment of the light receiving device as shown in FIG. 2. Except in that the micro lens (44) is provided, this third embodiment is similar to the above second embodiment of the light receiving device.

(6) Signal Processing

Figure 4:
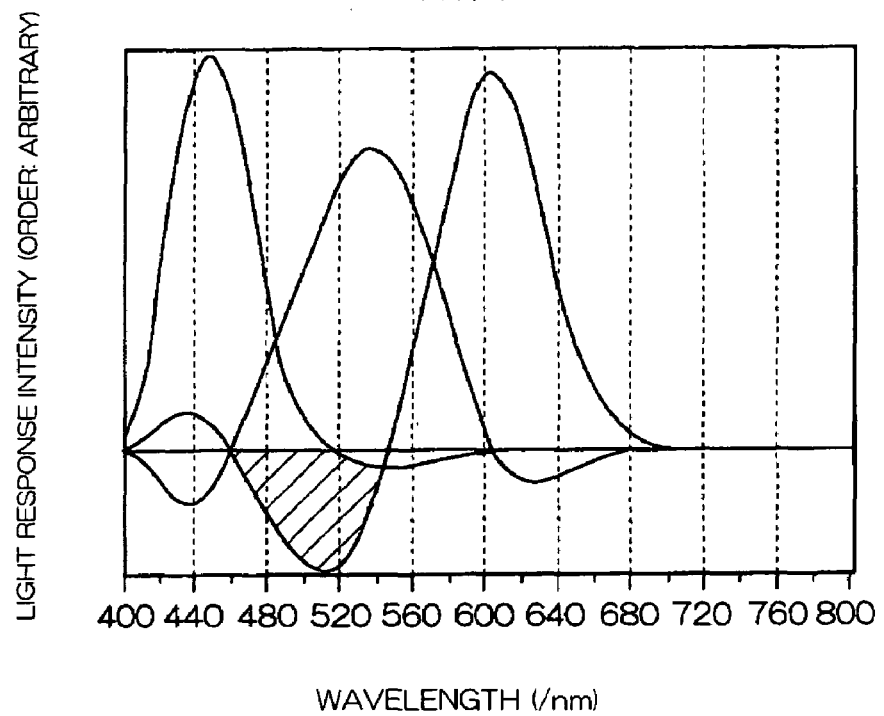
FIG. 4 is a figure illustrating an ideal spectral characteristics.
Figure 5:
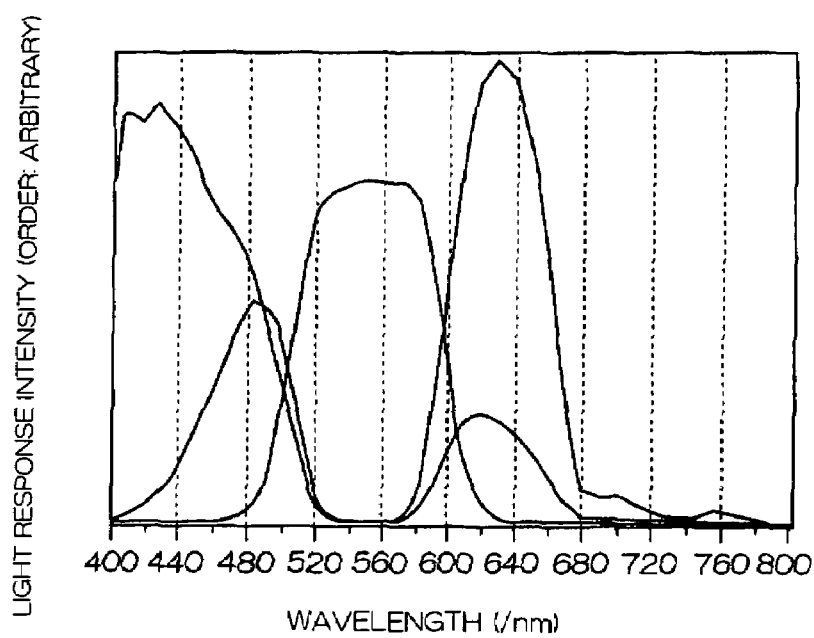
FIG. 5 is a figure illustrating a spectral characteristics of a conventional light receiving device.

In light receiving devices using the wavelength dependent absorption coefficient of Si, since there is a characteristic absorption of Si near to 480 nm, absorption of blue light in the red light receiving part has been conventionally a problem. FIG. 4 shows ideal spectral characteristics. As shown in FIG. 4 (the diagonally hashed area of), near to 520 nm there is a negative response for red light (stimulation line). In FIG. 5 is shown the spectral characteristics of a conventional Si stacked type sensor with a green sensitive layer at the upper portion. As can be seen from FIG. 5 the spectral characteristics obtained from a conventional Si stacked type sensor a negative response for red light is not considered. In particular, since the ability of the human eye to discriminate colors between blue and green is great, there is a large difference between the spectral sensitivity of a conventional Si stacked type sensor and that of the human eye—making for inferior color reproducibility.

In the invention, the blue-green light receiving part of the first photoelectric conversion part is provided and received light near to 480 nm, and by subtracting signal from the blue-green light receiving part from the signal of the red light receiving part, the red negative response can be considered, giving good color reproducibility.

To obtain ideal spectral characteristics, the blue-green light receiving part of the first photoelectric conversion part is provided, and the amount of light received by the first photoelectric conversion part is subtracted from the red signal, and added to the green signal. By such processing, the reproduction of the negative red response is very close to the spectral sensitivity of the human eye, and ideal spectral characteristics can be obtained.

(7) Applications

The above-described stacked light receiving device can be utilized not only as an image pickup device by arraying plural thereof, but also as an optical sensor, such as a bio-sensor or a chemical sensor, and a color light receiving device as a single unit.

Image Pickup Device (1) Outline of an Image Pickup Device of the Present Invention The image pickup device of the present invention includes a plurality of the above-described light receiving devices. By converting the input light into an electric signal, and reading out that signal, image pickup is carried out.

After a certain quantity of electric charge has been accumulated (in the photoelectric conversion mode) by injecting a certain quantity of bias charge into an accumulation diode (in the refresh mode), the signal charge can be read out. The light receiving device itself can also be utilized as an accumulation diode, and an accumulation diode can be separately added.

(2) Method for Signal Reading

A conventionally color read out circuit can be used for signal reading.

Signal charge or signal current, resulting from optical/electric conversion in the light receiving section, is accumulated in the light receiving section itself or an added capacitor. The accumulated electric charge is read out with the selection of the pixel location by the technique for what is called CCD or the technique for a MOS type image pickup device (so-called CMOS sensor) using an X-Y address method. For an appropriate method of readout transfer there is a method of readout according to which, by a transfer switch the charge signal of a pixel is transferred to an analogue shift register using a charge transfer unit, and by the operation of the register the signal is read out by a read out terminal. Methods such as line address, frame transfer and interline transfer, and frame interline transfer types may be listed. Also, for CCDs, known are two phase constructions, 3 phase constructions, or 4 phase constructions, and further constructions with buried channels. In the invention the construction is not particularly restricted and any construction can be appropriately used.

Examples of address selection methods further include a method that sequentially selects one pixel at a time with a multiplexer switch and a digital shift register, and reads it out to the common output line as a signal voltage (or charge). The two-dimensionally arrayed X-Y address-based image pickup device is known as a CMOS sensor. In this sensor, a switch provided for a pixel connected to an X-Y intersecting point is connected to a vertical shift register. When the switch is turned on with a voltage from a vertical scanning shift register, the signal, read out from the pixels provided in the same row, is read out to the output line in the row direction. These signals are sequentially read out at the output terminal through a switch driven by a horizontal scanning shift register.

For reading out the output signal, a floating diffusion detector or a floating gate detector can be used. In addition, by providing a signal amplification circuit for the pixel section or using a technique, such as correlated double sampling, a signal-to-noise ratio (S/N) can be improved.

For signal processing, gamma correction by an ADC circuit, digitization by an AD converter, brightness signal processing, or color signal processing can be performed. Examples of color signal processing include white balance processing, color separation processing, color matrix processing, and the like. When the image pickup device of the present invention is used with an NTSC signal, RGB signals can be converted to YIQ signals.

In view of electricity consumption, signal processing, reading speed and the like, it is preferable in the invention to extract light signals from the n-type layer of the stacked image sensor formed on the semiconductor substrate so as to use it as a CMOS sensor connected to a CMOS circuit.

(3) Embodiment of Image Pickup Device

Hereinafter, a preferable embodiment of the image pickup device of the present invention will be described in detail based on an attached drawing.

Figure 6:
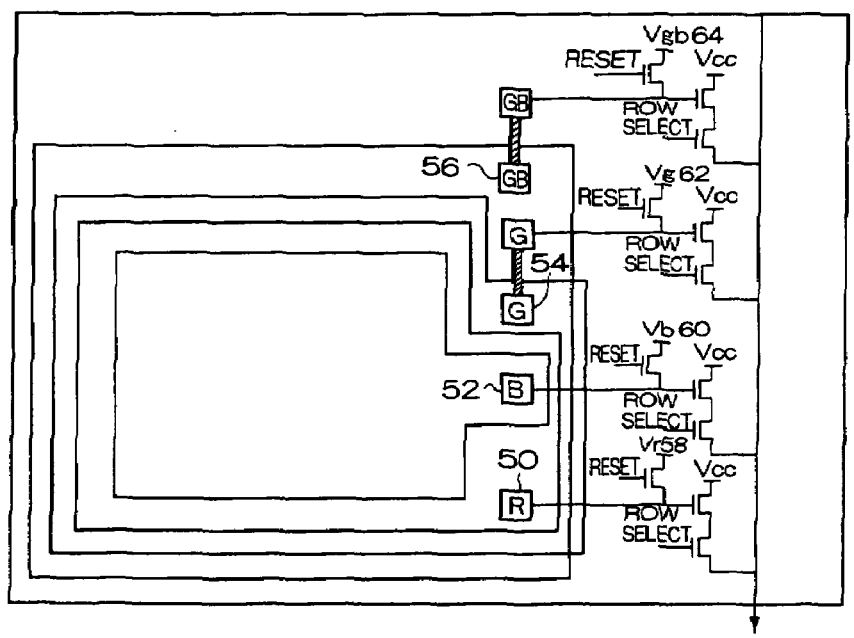
FIG. 6 is a read out circuit diagram for an image pickup device.

FIG. 6 is a circuit diagram for explaining one pixel as a light receiving device and a circuit for reading it out. The planar structure of the light receiving device is schematically expressed, with an equivalent read out circuit also being shown.

50 indicates a leading electrode for taking out a red signal from the n-type region (n well) (52); 52, a leading electrode for taking out a blue signal from the n-type region (n well) (56); 54, a leading electrode for taking out a green signal from the electrode (30); and 56, a leading electrode for taking out a blue-green signal from the electrode (26). These signals are amplification-processed by an amplifying circuit VCC and outputted. The electrodes (50) to (56) are connected to bias voltages $V_r$ (58), $V_b$ (60), $V_g$ (62), $V_{gb}$ (64), respectively, and can be subjected to a reset potential.

EXAMPLES

Hereinafter, the present invention will be described by giving examples. However, the following examples only indicate examples of the light receiving device and the image pickup device according to the present invention, and the applications for the image pickup device and the light receiving device according to the present invention are, of course, not limited to these. On the contrary, components may be further added, depending upon the application. The configuration and manufacturing methods are not particularly limited, if they are included within the above concept.

Example 1

Light Receiving Device Manufacturing

A npnp junction diode, as shown in FIG. 2, is formed and, as light receiving devices, on an outside part of the light entering side of a silicon substrate a first photoelectric conversion part and a second photoelectric conversion part are formed. The spectral sensitivity is then evaluated.

On the silicon substrate are alternately multiple stacked, from the light entering side, a p-type region of first photoelectric conversion part, and an n-type region of a second photoelectric conversion part, being of an opposite conductivity type to the first photoelectric conversion part. The respective depths of the pn junctions of the silicon substrate are made 0.151 μm, 0.20 μm, 1.3 μm, and 2.4 μm. The doping densities are, in order from the light entering side, made $1\times10^{18}$ cm$^{31}$ (p), $5\times10^{17}$ cm$^{-3}$ (n), $1\times10^{17}$ cm$^{-3}$ (p), $1\times10^{16}$ cm$^{-3}$ (n), and $1\times10^{15}$ cm$^{-3}$ (p-type substrate).

First Photoelectric Conversion Part

The depletion layers formed of p-n junctions are estimated based on the above doping concentration values. A total of 4 depletion layers are formed but, in order from the light entering side, the first depletion layer and the second depletion layer are approximately adjacent, and the electricity generated in these depletion layers moves into the n-type region between, and is detected as a B signal charge. In the same way, the third depletion layer and the fourth depletion layer are approximately adjacent, and the electricity generated in these depletion layers moves into the n-type region between, and is detected as an R signal charge. By using the wavelength dependency of the absorption coefficient of Si, the wavelength dependency of the above B and R signals is calculated.

The spectral sensitivity of the first and second photoelectric conversion parts is calculated based on the hypothesis that the wavelength dependency of the absorption coefficient is in the form of a Gauss function. The central absorption wavelength of the blue-green sensor is 520 nm, green sensor 550 nm, and the Gauss function half width is 50 nm. The size of the absorption peak of the absorption coefficient is $1.8\times10^{5}$ cm$^{-1}$. This value is equivalent to a mol absorption coefficient of a normal organic coloring material of $4\times10^{4}$M$^{-1}$cm$^{-1}$. In order to make an appropriate absorption ratio, a thickness of an organic semiconductor is set at 80 nm for the blue-green sensor, and at 400 nm for the green sensor, assuming that all of the absorbed light can be photoelectric converted.

The signal strengths of the blue, green, red and blue-green sensors obtained, based on the above model, Ib, Ig, Ir, and Igb respectively, are calculated as below. The spectral characteristics as shown in FIG. 3 are obtained.

$Ib'=Ib$ $Ig'=0.35\ Ig+0.4\ Igb$ $Ir'=Ir-0.25\ Igb$

Here Ib', Ig' and Ir' are respectively the calculated strengths of the blue, green and red signals which have been corrected. By subtracting the signal strength of the blue-green sensor from the strength of the before correction red signal, negative spectral characteristics can be realized. Also, since the signal strength of the green sensor is reduced, by the light absorption of the blue-green sensor, the blue-green sensor signal strength is added to the signal strength of the green sensor.

Figure 7:
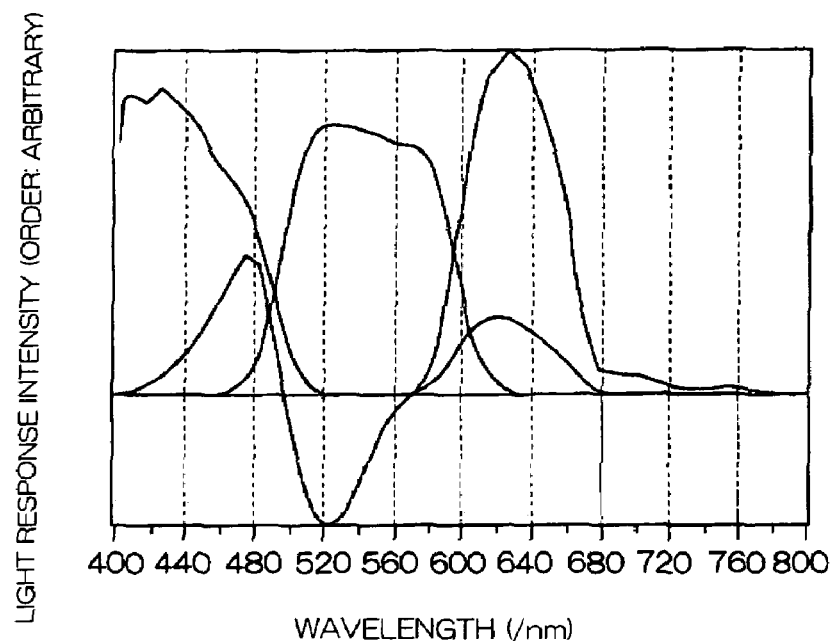
FIG. 7 is a figure illustrating a spectral characteristics of a light receiving device of the present invention.

By carrying out correction in such a way spectral characteristics as shown in FIG. 7 are obtained from the blue, green and red signal strengths.

In FIG. 7, the red negative response, which could not be obtained in a conventional Si substrate light receiving device, is considered, and spectral characteristics become near to the theoretical optimal shown in FIG. 4.

Example 2

The light receiving device of Example 1 is used, and the second signal calculation is carried out as shown below.

Second Signal Calculation $Ib''=Ib-0.03\ Ig-0.23\ Ir$ $Ig''=-0.08\ Ib+0.35\ Ig-0.08\ Ir+0.4\ Igb$ $Ir''=-0.015\ Ib+Ir-0.25\ Igb$ Here Ib", Ig" and Ir" are respectively the strengths of the blue, green and red signals calculated for Example 1 which have been additionally corrected. Normally, when such a matrix method of calculation is carried out for signals, noise is not calculated sufficiently and S/N ratio is reduced. However, since in the invention the RGB color separation is superior, the non-diagonal elements (coefficients of Ig and Ir which occur in Ib", the coefficients of Ib and Ir which occur in Ig", and the coefficients of Ib and Ig which occur in Ir") are sufficiently small, and without a large reduction in the S/N ratio all of the negative spectral sensitivity can be realized.

Figure 8:
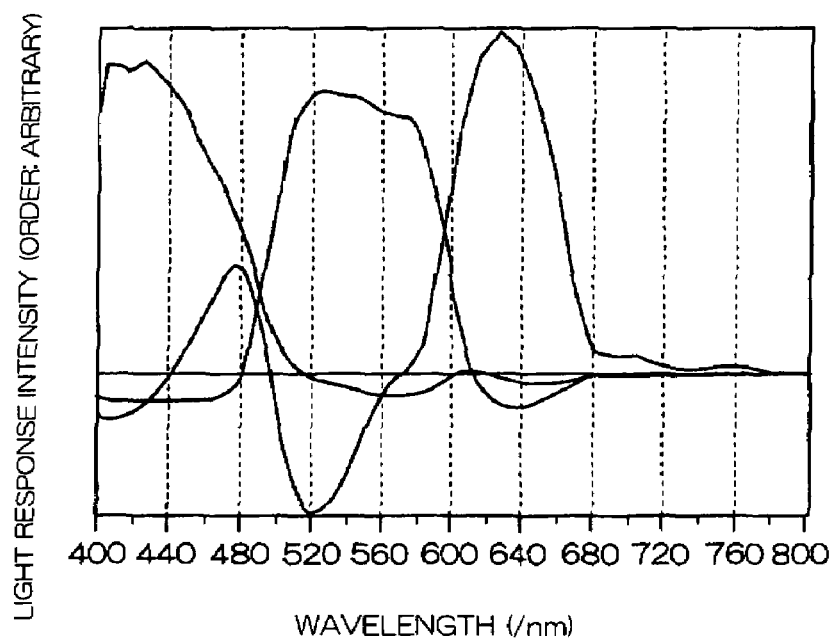
FIG. 8 is a figure illustrating a spectral characteristics of a light receiving device of the present invention when a minor adjustment is conducted based on a matrix calculation.

The corrected blue, green and red signal strengths according to this calculation are shown in FIG. 8. As can be seen in FIG. 8, not only the red sensor negative spectral characteristic, but also the negative spectral characteristics of the blue sensor and green sensor are realized.

What is claimed is:

1. A light receiving device comprising a single semiconductor substrate and a light receiving device that has a first photoelectric conversion part and a second photoelectric conversion part and is provided on or above an light entering side of the semiconductor substrate, wherein:

the single semiconductor substrate comprises regions of a first conductivity type and regions of a second conductivity type in an alternately multiply stacked manner, wherein the second conductivity type is a conductivity type opposite to the first conductivity type;

each of junction surfaces between the regions of the first conductivity type and the regions of the second conductivity type is formed to have a depth which enables converting light, which is mainly in the blue or red wavelength regions, to electricity;

the first photoelectric conversion part and second photoelectric conversion part detect light in two different wavelength regions; and the respective detected wavelengths of the first photoelectric conversion part and second photoelectric conversion part are longer than the central wavelength of the blue wavelength region, and shorter than the central wavelength of the red wavelength region.

2. A light receiving device according to claim 1, wherein an insulating layer is provided between the semiconductor substrate and the photoelectric conversion parts.

3. A light receiving device according to claim 1, wherein the photoelectric conversion parts and the semiconductor substrate are spaced apart from each other provided with a separation between each other.

4. A light receiving device according to claim 1, wherein the semiconductor substrate is a silicon substrate, and has a structure selected from the group consisting of an npn junction and a pnpn junction, in which the p-n order is listed from the light entering side of the silicon substrate.

5. A light receiving device according to claim 1, wherein the first photoelectric conversion part has a maximum value in a frequency range of 500 to 530 nm, and the second photoelectric conversion part has a maximum value in a frequency range of 530 to 600 nm.

6. A light receiving device according to claim 1, wherein the first photoelectric conversion part is disposed closer to the light entering side than the second photoelectric conversion part.

7. A light receiving device according to claim 1, wherein the first photoelectric conversion part and the second photoelectric conversion part are respectively made from organic semiconductors.

8. An image pickup device in which a plurality of light receiving devices are arranged, wherein the light receiving device comprises a light receiving device comprising a single semiconductor substrate and a light receiving device that has a first photoelectric conversion part and a second photoelectric conversion part and is provided on or above an light entering side of the semiconductor substrate, wherein:

the single semiconductor substrate comprises regions of a first conductivity type and regions of a second conductivity type in an alternately multiply stacked manner, wherein the second conductivity type is a conductivity type opposite to the first conductivity type;

each of junction surfaces between the regions of the first conductivity type and the regions of the second conductivity type is formed to have a depth which enables converting light, which is mainly in the blue or red wavelength regions, to electricity;

the first photoelectric conversion part and second photoelectric conversion part detect light in two different wavelength regions; and the respective detected wavelengths of the first photoelectric conversion part and second photoelectric conversion part are longer than the central wavelength of the blue wavelength region, and shorter than the central wavelength of the red wavelength region.

9. An image pickup device according to claim 8, wherein an insulating layer is provided between the semiconductor substrate and the photoelectric conversion parts.

10. An image pickup device according to claim 8, wherein the photoelectric conversion parts and the semiconductor substrate are spaced apart from each other provided with a separation between each other.

11. An image pickup device according to claim 8, wherein the semiconductor substrate is a silicon substrate, and has a structure selected from the group consisting of an npn junction and a pnpn junction, in which the p-n order is listed from the light entering side of the silicon substrate.

12. An image pickup device according to claim 8, wherein the first photoelectric conversion part has a maximum value in a frequency range of 500 to 530 nm, and the second photoelectric conversion part has a maximum value in a frequency range of 530 to 600 nm.

13. An image pickup device according to claim 8, wherein the first photoelectric conversion part is disposed closer to the light entering side than the second photoelectric conversion part.

14. An image pickup device according to claim 8, wherein the first photoelectric conversion part and the second photoelectric conversion part are respectively made from organic semiconductors.

15. An image pickup device according to claim 8, which is used as a CMOS image sensor.

16. An image pickup device according to claim 8, which is used as a CCD image sensor.

* * * * *